(12) United States Patent
Aizenberg et al.

(10) Patent No.: US 7,764,004 B2
(45) Date of Patent: Jul. 27, 2010

(54) LARGE AREA INDUCED ASSEMBLY OF NANOSTRUCTURES

(75) Inventors: Joanna Aizenberg, New Providence, NJ (US); Thomas N. Krupenkin, Warren, NJ (US); Oleksandr Sydorenko, Painted Post, NY (US); Joseph A. Taylor, Springfield, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 392 days.

(21) Appl. No.: 11/773,534

(22) Filed: Jul. 5, 2007

(65) Prior Publication Data

US 2008/0095977 A1 Apr. 24, 2008

Related U.S. Application Data

(60) Provisional application No. 60/822,457, filed on Aug. 15, 2006.

(51) Int. Cl.
*B01L 3/00* (2006.01)
*B32B 3/00* (2006.01)
*A01K 1/015* (2006.01)

(52) U.S. Cl. .................. 310/311; 310/800; 422/99; 428/156

(58) Field of Classification Search .......... 310/328, 310/800; 428/156
See application file for complete search history.

(56) References Cited

U.S. PATENT DOCUMENTS 6,066,911 A * 5/2000 Lindemann et al. .... 310/323.02

| | | | |
|---|---|---|---|
| 6,222,303 B1* | 4/2001 | Nakamura et al. | 310/328 |
| 6,720,712 B2* | 4/2004 | Scott et al. | 310/339 |
| 6,864,620 B2* | 3/2005 | Takeuchi et al. | 310/334 |
| 7,061,161 B2* | 6/2006 | Scher et al. | 310/328 |
| 7,075,213 B2* | 7/2006 | Krill | 310/328 |
| 7,358,649 B2* | 4/2008 | Scher et al. | 310/333 |
| 7,443,078 B1* | 10/2008 | DuBrucq | 310/328 |
| 2004/0201324 A1* | 10/2004 | Takeuchi et al. | 310/328 |
| 2006/0158065 A1* | 7/2006 | Pelrine et al. | 310/328 |

OTHER PUBLICATIONS

Responsive Polymer Membrane and Templates (http://.people.clarkson.edu/~ sminko/nanostructured/responsive-smart-materials/responsive-polymer-membranes-templates.html) (no date).*

Xie, X.L. et al, Dispersion and Alignment of Carbon Nanotubes in Polymer Matrix: A Review, Materials Science and Engineering R 49 (2005), pp. 89-112.*

Melechko, A.V. et al, Vertically aligned carbon nanofibers and related structures: Controlled synthesis and directed assembly, Journal of Applied Physics 97, (2005).*

(Continued)

*Primary Examiner*—J. SanMartin
(74) *Attorney, Agent, or Firm*—Hitt Gaines, PC

(57) ABSTRACT

Provided is an apparatus. In one embodiment, this apparatus includes a substrate having a surface, and a plurality of nanostructures each having a first end and a second end, wherein the first end of each of the plurality of nanostructures is attached to the surface. At least a portion of the second ends of the plurality of nanostructures, in this embodiment, are bent toward one another to form two or more similarly configured clumps each including two or more nanostructures.

22 Claims, 6 Drawing Sheets

OTHER PUBLICATIONS

Ren, Z.F. et al. Synthesis of Large Arrays of WEII-Aligned Carbon Nanotubes on Glass, Science 282 (Nov. 6, 1998), pp. 1105-1107.*

Fan, J.G., et al.; "Nanocarpet Effect: Pattern Formation during the Wetting of Vertically Aligned Nanorod Arrays"; Nano Letters American Chemical Society, vol. 4, No. 11, Nov. 2004 (XP-002506548), pp. 2133-2138.

Fan, J.G., et al.; "Characterization of Watermarks Formed In Nano-Carpet Effect"; American Chemical Society, Langmuir 2006, vol. 22, No. 8, Apr. 11, 2006 (XP0025065490); pp. 3662-3671.

Zhao, Y.P., et al.; "Clusters Of Bundled Nanorods In Nanocarpet Effect"; Applied Physics Letters, AIP, American Institute of Physics, vol. 88, No. 10; Mar. 10, 2006 (XP012080519); pp. 103123-1-3.

Majidi, C., et al.; "Clumping And Packing Of Hair Arrays Manufactured By Nanocasting"; American Society of Mechanical Engineers,, Nov. 2004, vol. 4; (XP008099296); pp. 579-584.

Geim, A.K., et al.; "Microfabricated Adhesive Mimicking Gecko Foot-Hair"; Nature Materials, vol. 2, Jul. 2003; www.nature.com/naturematerials; XP002506550; pp. 461-463.

Patent Cooperation Treaty Searching Authority Search for related case PCT/US2007/017923 dated Dec. 22, 2008; 5 Pages.

* cited by examiner

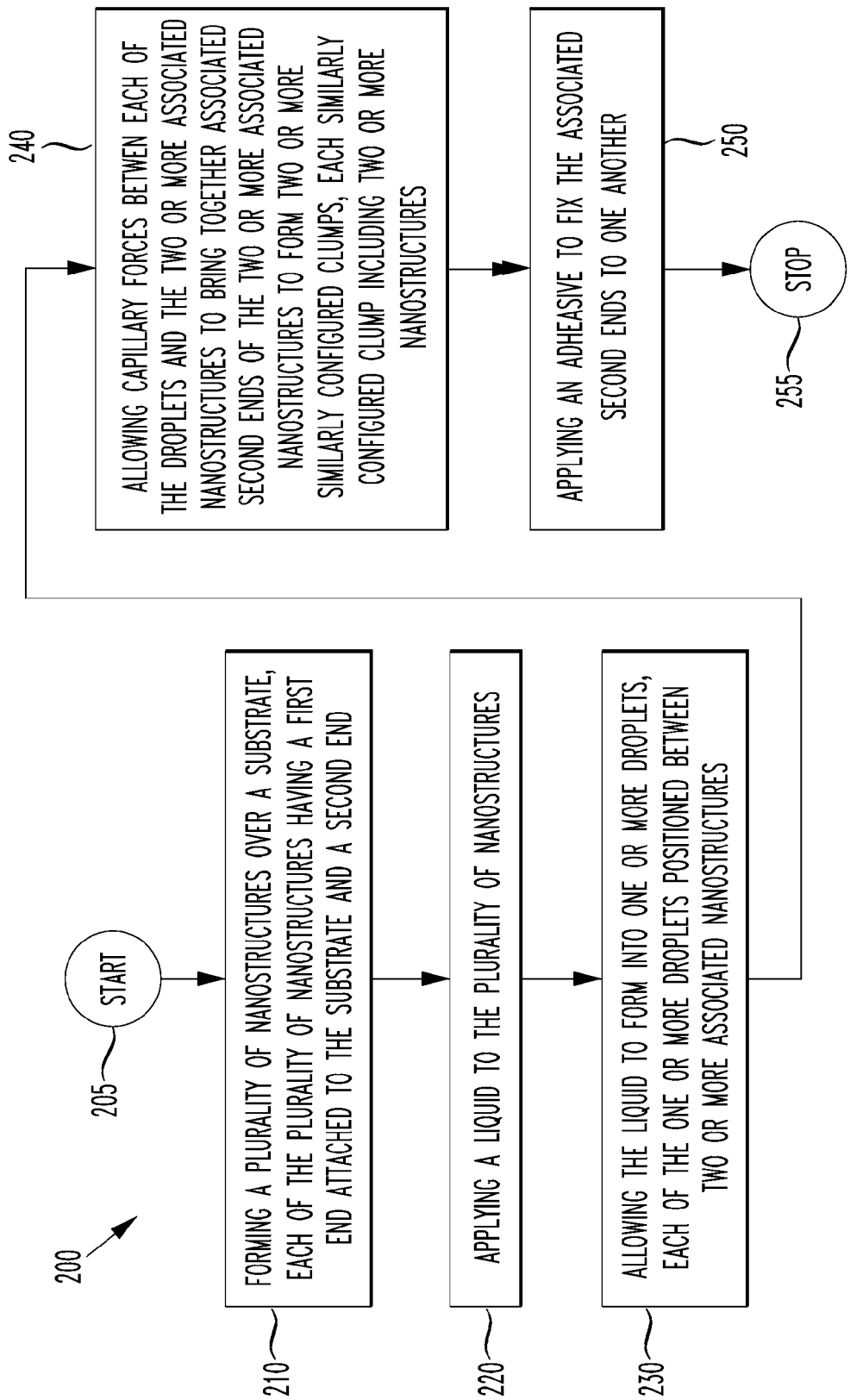

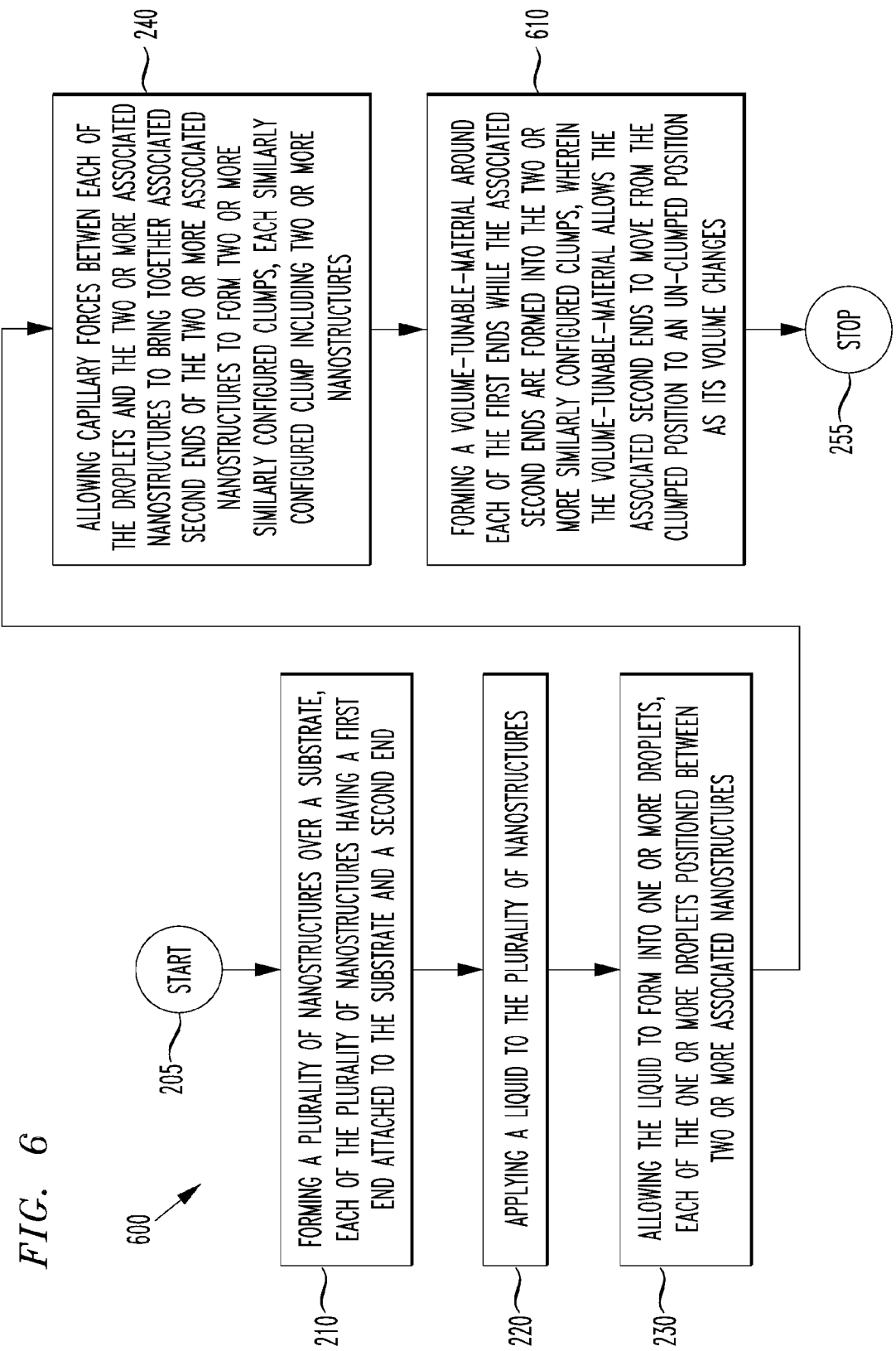

LARGE AREA INDUCED ASSEMBLY OF NANOSTRUCTURES

CROSS-REFERENCE TO RELATED APPLICATION

This Application claims the benefit of U.S. Provisional Application Ser. No. 60/822,457 filed on Aug. 15, 2006, entitled "LARGE AREA INDUCED ASSEMBLY OF NANOSTRUCTURES," commonly assigned with the present invention and incorporated herein by reference.

TECHNICAL FIELD

The present invention is directed, in general, to nanostructures.

BACKGROUND

Nanostructures have recently found use in a myriad of applications. For example, nanostructures have found use in various biological applications, including biochips, labs-on-a-chip, etc. Additionally, nanostructures have found use in electrical interconnect applications, fluid mobility applications, battery applications, and a host of other applications. There is currently a desire to find additional (e.g., new) uses for such nanostructures.

Accordingly, what is needed in the art is a new nanostructure apparatus, method of manufacture thereof and/or use for the same.

SUMMARY OF THE INVENTION

Provided is an apparatus. In one embodiment, this apparatus includes a substrate having a surface, and a plurality of nanostructures each having a first end and a second end, wherein the first end of each of the plurality of nanostructures are attached to the surface. At least a portion of the second ends of the plurality of nanostructures, in this embodiment, are bent toward one another to form two or more similarly configured clumps, each including two or more nanostructures.

Also provided is a method of manufacture. The method of manufacture, without limitation, may include forming a plurality of nanostructures over a substrate, each of the plurality of nanostructure having a first end attached to the substrate and a second end. The method of manufacture may further include bringing together at least a portion of the second ends to form two or more similarly configured clumps, each of the two or more similarly configured clumps including two or more nanostructures.

Further provided is a method of use. The method of use, in an embodiment, may include providing an apparatus, wherein the apparatus includes: 1) a substrate having a surface, 2) a plurality of nanostructures each having a first end and a second end, wherein the first end of each of the plurality of nanostructures is attached to the surface, and 3) a volume-tunable-material encompassing the first ends. The method of use may further include exposing the volume-tunable-material to a stimulus, the stimulus changing a thickness of the volume-tunable-material. The change of thickness of the volume-tunable-material may either bring together at least a portion of the second ends to form two or more similarly configured clumps of two or more nanostructures, or move apart the second ends of two or more similarly configured clumps of two or more nanostructures.

BRIEF DESCRIPTION OF THE DRAWINGS

For a more complete understanding of the present invention, reference is now made to the following descriptions taken in conjunction with the accompanying drawings, in which:

FIG. 2 illustrates a flow diagram indicating how one might manufacture an apparatus according to the disclosure;

FIG. 6 illustrates a flow diagram indicating how one might manufacture an apparatus according to an alternative embodiment of the disclosure.

DETAILED DESCRIPTION

Figure 1A:
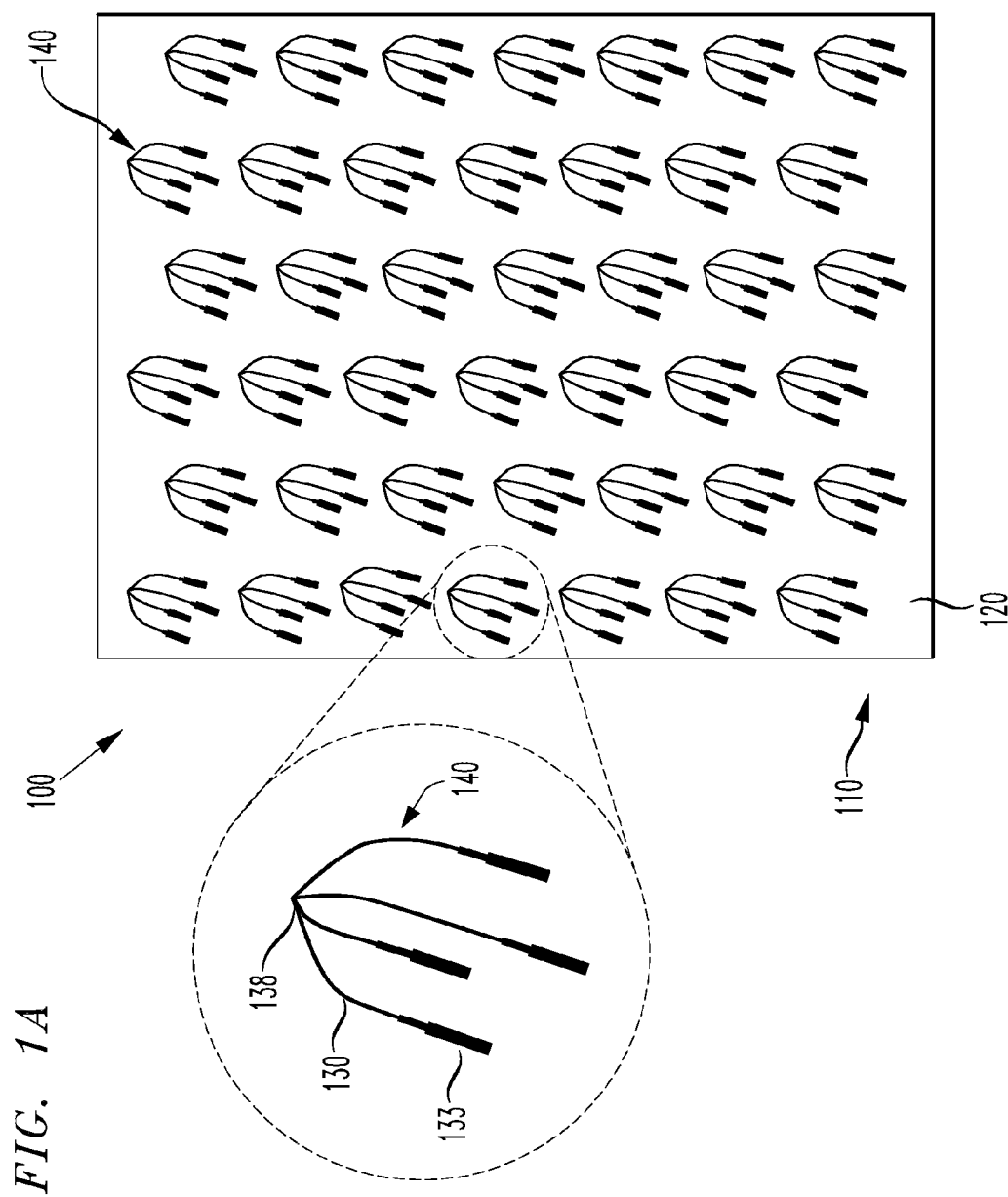
FIG. 1 illustrates an embodiment of an apparatus manufactured according to the disclosure.

FIG. 1 illustrates an embodiment of an apparatus manufactured according to the disclosure. The apparatus 100 of FIG. 1 includes a substrate 110 having a surface 120. The substrate 110, in one embodiment, comprises a planar substrate. For instance, the substrate 110 may comprise a silicon wafer in one embodiment. In yet an even different embodiment, the substrate 110 may comprise a silicon-on-insulator (SOI) wafer. Accordingly, the SOI wafer would generally have an insulating layer of silicon oxide disposed between upper and lower silicon layers. Additionally, the substrate 110 may be topographically patterned, as opposed to flat in other embodiments. In yet different embodiments, the substrate 110 can comprise a single layer or plurality of planar layers made of other conventional materials.

Attached to the surface 120 of the substrate 110 is a plurality (e.g., array in one embodiment) of nanostructures 130, e.g., elongated nanostructures. The term "nanostructure" as used herein refers to a predefined raised isolated feature on a surface that has at least one dimension that is 1 micron or less. The plurality of nanostructures 130, without limitation, may comprise a regular two-dimensional array of substantially identical nanoposts. The term "post", as used herein, includes any structures having round, square, rectangular or other cross-sectional shapes. Each of the plurality of nanostructures 130 depicted in FIG. 1 is post-shaped, and more specifically, cylindrically shaped posts. Alternatively, the plurality of nanostructures 130 may be a regular two-dimensional array of substantially identical nanoposts, a plurality or regular array (e.g., one-dimensional) of substantially identical nanoplates, etc. Accordingly, these embodiments are not limited to any specific nanofeature.

The plurality of nanostructures 130 each have a first end 133 and a second end 138. The first end 133 of each of the plurality of nanostructures 130, in this embodiment, is attached to the surface 120. Moreover, at least a portion of the second ends 138 of the plurality of nanostructures 130 are bent toward one another to form two or more similarly configured clumps 140. The term "similarly configured" as used herein, means that the clumps 140 are intentionally formed (e.g., non-trivial) to have a general likeness to one another (e.g., comprise the same number of nanostructures, have somewhat similar shapes, etc.) as opposed to being random clumps of nanostructures, as might be seen in the art.

In the embodiment of FIG. 1, the associated second ends 138 of each of the clumps 140 are touching. For example, the associated second ends 138 of each of the clumps 140 might be fixed together. In this embodiment an adhesive, such as calcium carbonate, might be used to fix the associated second ends 138 in place. In an alternative embodiment the adhesive might comprise any inorganic, organic, or polymeric material that will form at the tips of the structure from the water droplet: e.g., AgCl, CdS, magnetite, colloidal particles or polymer, in various different embodiments. In yet a different embodiment an alternative configuration might be used to fix the associated second ends 138 in place. As will be evident below, the associated second ends 138 need not always touch one another, as well as need not always be fixed in place.

The embodiment of FIG. 1 illustrates that each of the similarly configured clumps 140 includes only four nanostructures 130. Alternative embodiments exist wherein each of the clumps 140 includes less or more than four nanostructures 130. For example, in one alternative embodiment the clumps 140 each include only two nanostructures 130. In yet a different embodiment, each of the clumps 140 might include from about 3 to about 9 nanostructures. As long as the plurality of nanostructures 130 bend toward one another to form two or more similarly configured clumps, and each of the similarly configured clumps includes at least two nanostructures, just about any configuration might exist.

The number of similarly configured clumps 140 on a given substrate 110 will also vary. In one example embodiment, an array of hundreds or even thousands of similarly configured clumps 140 exist on a given substrate. In yet a different embodiment, a first array of one set of similarly configured clumps and a second array of a different set of similarly configured clumps exist on the same substrate. Many different scenarios could obviously exist.

Turning to FIG. 2, illustrated is a flow diagram 200 indicating how one might manufacture an apparatus according to the disclosure. For purposes of discussion, an apparatus similar to the apparatus 100 of FIG. 1 will be discussed with respect to the flow diagram 200 of FIG. 2. Nevertheless, in a different embodiment, the flow diagram 200 of FIG. 2 might be used to manufacture an apparatus different from the apparatus 100 of FIG. 1.

The flow diagram 200 begins in a start step 205. Thereafter, in a step 210, a plurality of nanostructures 130 are formed over a substrate 110. The plurality of nanostructures 130 may be manufactured using many different processes. In one embodiment, however, the plurality of nanostructures 130 are formed from a surface of a silicon or silicon-on-insulator substrate by conventional photolithographic and dry reactive ion etching (DRIE) procedures. For example, a DRIE process such as the Bosch process, as presented in U.S. Pat. No. 5,501,893, which is incorporated herein by reference as if entirely reproduced herein, could be used to define the plurality of nanostructures 130. Nevertheless, other processes might also be used to form the plurality of nanostructures 130, such as molding of the structure out of a polymeric material.

The plurality of nanostructures 130, at least in the embodiment of FIG. 2, comprise a regular array of substantially identical nanostructures 130. For example, the plurality of nanostructures 130 comprise well-defined nanocolumns with diameters of about 200-300 nm, heights of about 5-10 μm and periodicities of about 2-4 μm. Accordingly, the plurality of nanostructures 130 are arrays of isolated high-aspect-ratio rigid structures (AIRS).

The layout and the geometry (sizes) of the plurality of nanostructures 130 on the substrate 110 may be important to the resulting apparatus 100. For example, the layout of the plurality of nanostructures 130 may be used to control the number of nanostructures 130 that come together to form each clump 140 (see step 240). For instance, the pitch, the width, and the length of each nanostructure 130 within a single row, as well as the radial direction of adjacent rows may be used to configure the clumps 140. In one embodiment wherein the radial direction of one nanostructure 130 in one row is in line with another nanostructure 130 in an adjacent row, the plurality of nanostructures 130 may form clusters of two. Alternatively, in another embodiment wherein the radial direction of one nanostructure 130 in one row is at a 45 degree angle to another nanostructure 130 in an adjacent row, the plurality of nanostructures 130 may form clusters of four. Yet even different configurations may be obtained by modifying the pitch of the nanostructures within a row and radial direction of adjacent rows. It should additionally be noted that the shape and size of the plurality of nanostructures 130 may also be used to obtain yet different configurations. The amount of bending in the nanostructures may be controlled by capillary forces induced in the liquid.

After defining the plurality of nanostructures 130, for example using the Bosch process, the plurality of nanostructures 130 may be cleaned. In one embodiment, the plurality of nanostructures 130 are cleaned using an argon (Ar) plasma, and are then allowed to mature at conditions configured to induce the formation of silanol groups. The surfaces are often then fluorinated to form a water-repelling, hydrophobic array.

After forming the plurality of nanostructures 130, a liquid may be applied to the plurality of nanostructures in a step 220. The liquid, in this embodiment, may be any liquid configured to form into one or more liquid droplets, and ultimately any liquid that would allow its one or more droplets to bring together associated second ends 138 of the plurality of nanostructures 130 into two or more similarly configured clumps 140, for example using capillary forces.

The liquid may comprise many different materials. For instance, the liquid in one embodiment is water. In an alternative embodiment the liquid is calcium chloride solution in water and the carbon dioxide is allowed to diffuse in to form calcium carbonate deposits. In yet a different embodiment the liquid might comprise a water solution of a monomer that polymerizes at the tips in response to temperature or UV radiation, a solution of any inorganic salt or oxide in water that is allowed to evaporate and deposit at the tips (such as sodium chloride, silver bromide, cadmium sulfide, zinc oxide, iron oxides, a colloidal suspension that releases the colloidal particles at the tips and holds them together by the Van der Waals forces or another related liquid. The liquid may also be placed in contact with the plurality of nanostructures 130 using various different processes. In one embodiment, the substrate 110 having the plurality of nanostructures 130 is submerged in a container of the liquid. In another embodiment a dropper type mechanism is used to dispense the liquid directly on the substrate 110 having the plurality of nanostructures 130. Other processes could also be used.

In a step 230 the liquid is allowed to form into one or more droplets. In this embodiment, each of the one or more droplets would be positioned between two or more associated nanostructures 130. In the instance wherein the nanostructures 130 ultimately clump into four nanostructures 130, a droplet of liquid would exist between each of the associated four nanostructures 130. In the instance wherein the nanostructures 130 ultimately clump into two nanostructures 130, a droplet of liquid would exist between each of the associated two nanostructures 130, and so on.

It is believed that the formation of the first droplet of liquid sets the tone for the additional droplets. For instance, if the first droplet of liquid forms at a specific location between four associated nanostructures 130, additional droplets of liquid would propagate from that initial location in similar configurations and form a regular array of self-replicating clumps. Thus, in the embodiment of FIG. 1, it is believed that the droplets of liquid would propagate from this initial location and be located between associated groups of four nanostructures 130. If the initial droplet of liquid were to form between only two nanostructures 130, it would typically propagate in pairs of two nanostructures 130 from this initial location.

In certain instances the droplet formation will propagate from two or more different locations. This scenario would often result in defects in the propagation scheme, and act somewhat like a grain boundary in the apparatus. In those embodiments wherein this type of configuration is not desirable, special attention should be taken during step 210, wherein the nanostructures 130 are being formed. For example, it is believed that the precise placement of the plurality of nanostructures 130 and the positioning of the first droplet will generally set up only a single propagation.

In a step 240, capillary forces in each of the droplets of liquid brings the second ends 138 of the associated nanostructures 130 together to form two or more similarly configured clumps 140. For example, because of the capillary forces (e.g., the need for the droplet of liquid to move to the smallest diameter in the capillary) the associated second ends 138 are brought together to form the similarly configured clumps 140 of two or more nanostructures 130. Those skilled in the art of capillary forces would understand the phenomenon occurring, as well as understand what additional processes or techniques might be used to control and/or modify the capillary forces.

It should be noted that steps 230 and 240 may occur concurrently and/or with very little time therebetween. For example, in certain instances the moment the first droplet of liquid forms it will then begin its capillary motion. The subsequent droplets and subsequent capillary movement of each droplet would then follow. That being said, in one embodiment there is no fixed order for steps 230 and 240, especially when comparing different droplets and the capillary movement thereof.

Thereafter, in a step 250, and while the capillary forces are still holding the plurality of nanostructures 130 into the two or more similarly configured clumps 140, an adhesive may be applied thereto to fix the associated second ends 138 of the plurality of nanostructures 130. What would result, in one embodiment, are two or more (often an array) of similarly configured clumps 140 that are fixed in a specific configuration. As indicated above, adhesives such as calcium carbonate, other ionic salts, colloidal particles, nanotubes, polymers, metal oxides and hydroxides, among others, might be used to fix the similarly configured clumps 140.

In certain instances, the adhesive is chosen such that it may be removed and/or released. For example, in the embodiment wherein calcium carbonate is used as the adhesive, the adhesive bond may be removed by subjecting the adhesive to a temperature of about 150° C., or by exposing it to an acid. Obviously, if another adhesive were used, other processes might be used to remove their adhesive bonds. At some point after completing step 250, the process would then end in a stop step 255.

Figure 3:
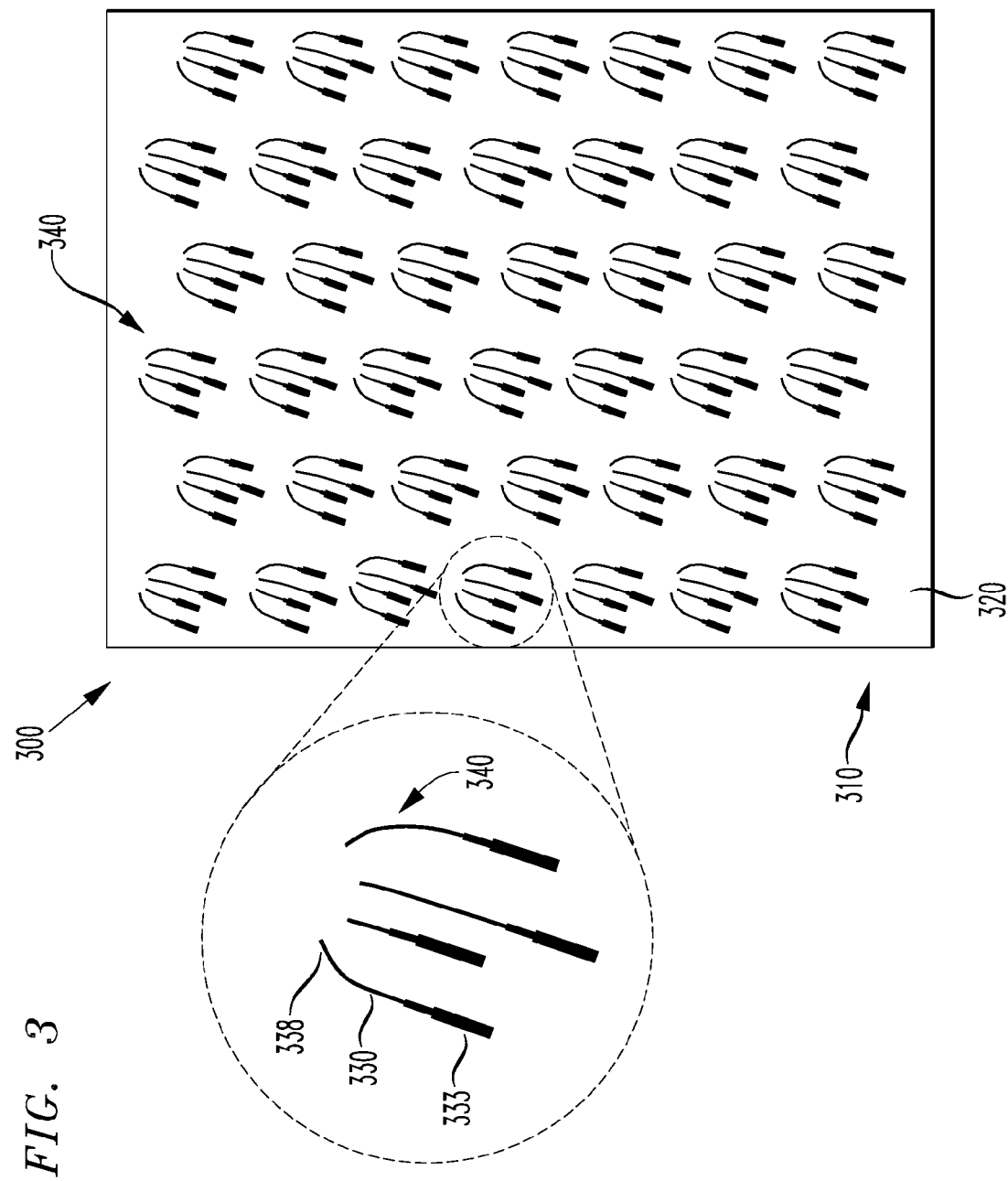
FIG. 3 illustrates an alternative embodiment of an apparatus manufactured in accordance with the disclosure.

FIG. 3 illustrates an alternative embodiment of an apparatus 300 manufactured in accordance with the disclosure. The apparatus 300 of FIG. 3 is similar to the apparatus 100 of FIG. 1 but for a few slight modifications. The apparatus 300 includes a plurality of nanostructures 330, having first ends 333 and second ends 338, coupled to a surface 320 of a substrate 310. However, as opposed to the second ends 138 of nanostructures 130, the second ends 338 of the nanostructures 330 are not touching, but remain bent toward one another.

This slight modification may be accomplished in a number of different ways. For example, in one embodiment, a material may be added to at least a portion of the plurality of nanostructures 330 that has plastic deformation. In this embodiment, the plurality of nanostructures 330 would be brought together using a process similar to that disclosed above with respect to FIG. 2. In this embodiment, however, after the adhesive bonds are released (or in the embodiment that no adhesive bond is formed, after the capillary forces break down) the plastic deformation in the nanostructures 330 would cause the associated second ends 338 thereof to remain at least partially bent towards one another. Such a scenario is illustrated by the clumps 340 of FIG. 3.

The material adding the plastic deformation component may vary. In one embodiment, however, the material is a graded layer of gold/silicon. In this embodiment, after releasing the bond (whether it be an adhesive bond or capillary bond) the silicon would straighten up and the gold would remain at least partially deformed. In an alternative embodiment, the material might be a polymeric coating, other metals, such as copper, silver, chromium, etc. or metal oxides. Nevertheless, many different materials might also be used. Those skilled in the art would understand the processes required to include the material adding the plastic deformation component.

Figure 4:
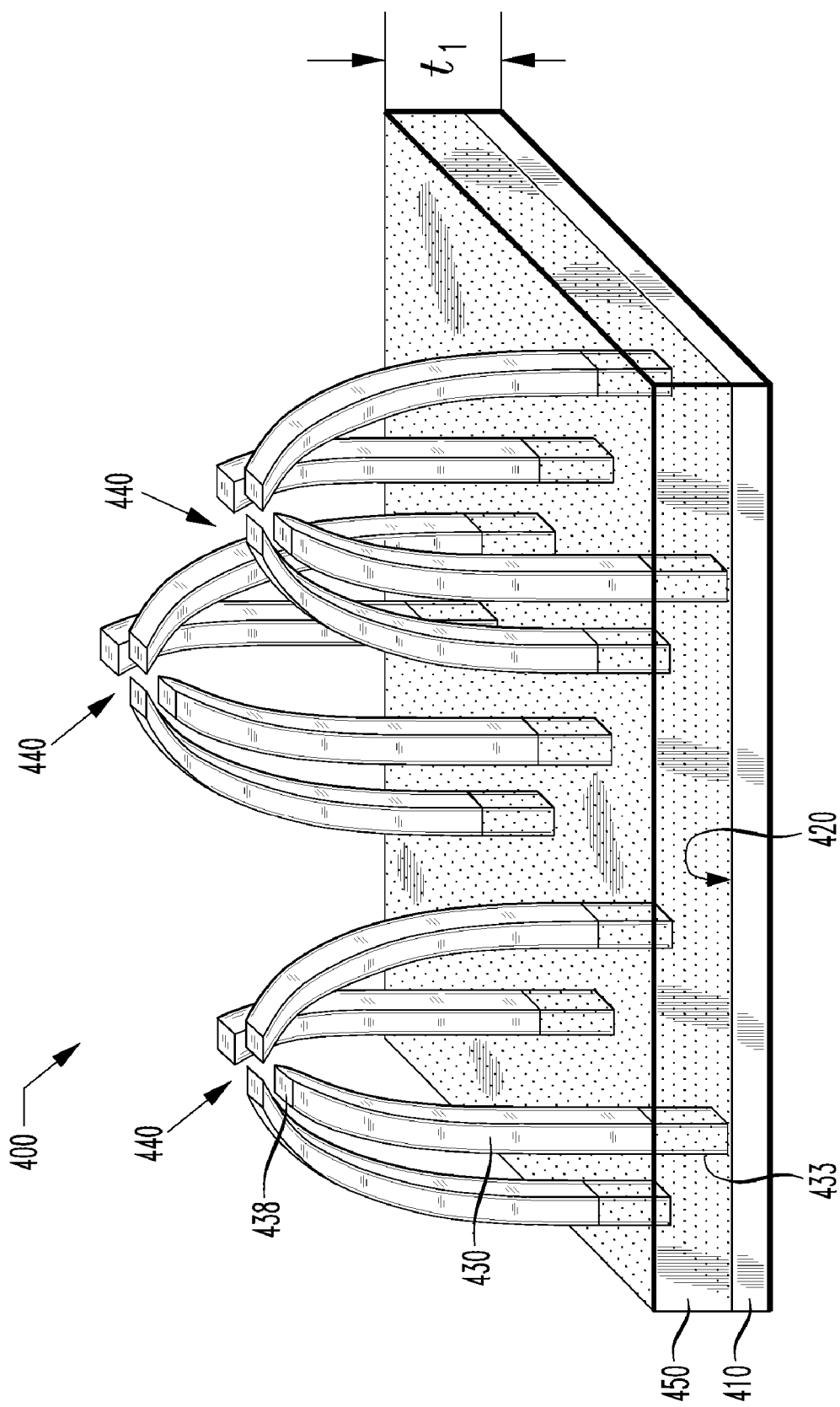
FIGS. 4 and 5 illustrate yet another embodiment of an apparatus manufactured in accordance with the disclosure.
Figure 5:
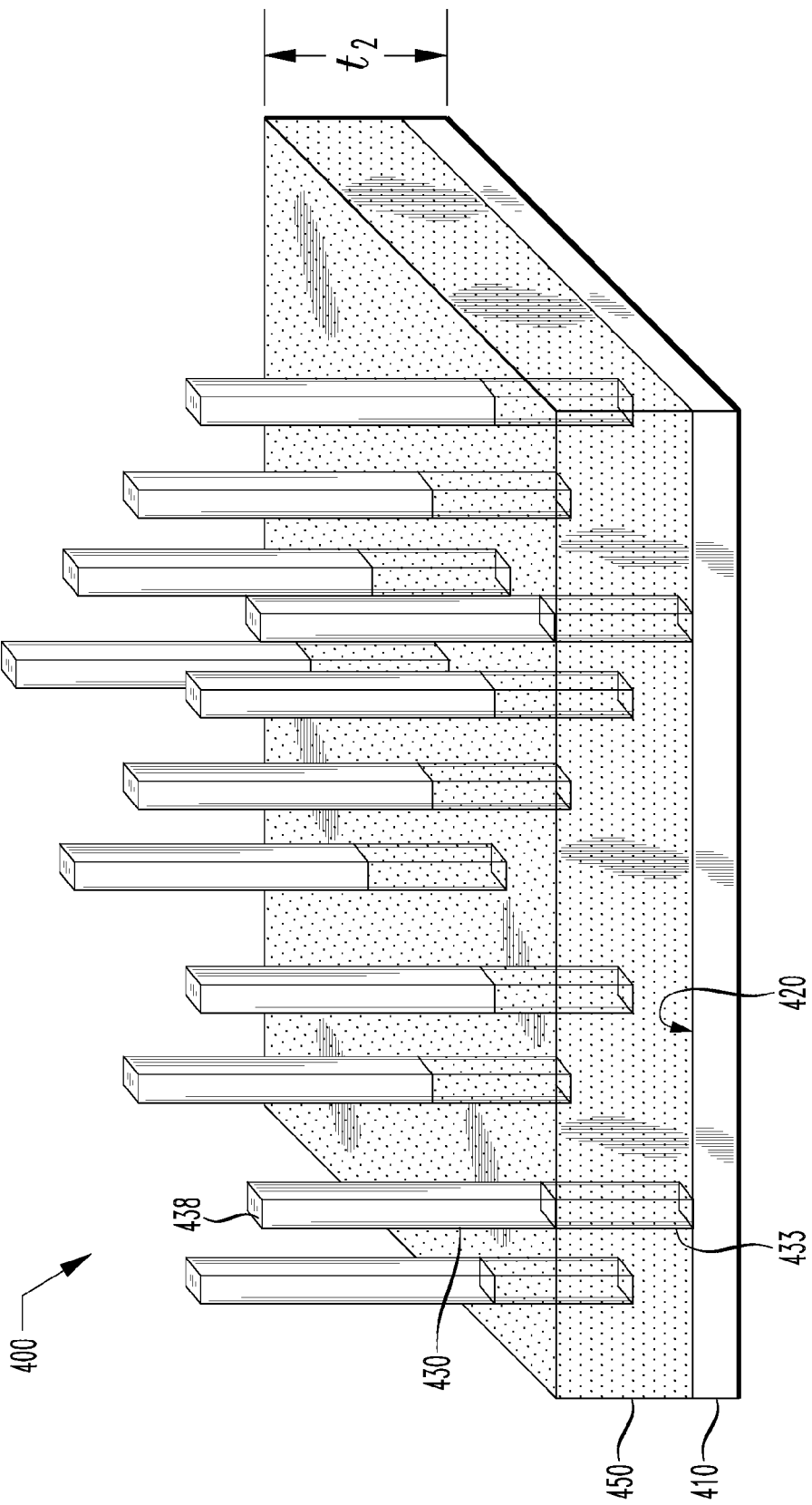

FIGS. 4 and 5 illustrate yet another embodiment of an apparatus 400 manufactured in accordance with the disclosure. As is shown, FIG. 4 illustrates the apparatus 400 in one configuration, whereas FIG. 5 illustrates the same apparatus 400 in an alternative configuration. The apparatus 400 includes a substrate 410 having a surface 420. Attached to the surface 420 of the substrate 410 is a plurality of nanostructures 430. More specifically, a first end 433 of each of the plurality of nanostructures 430 is attached to the surface 420. The substrate 410 and nanostructures 430 are substantially similar to the substrate and nanostructures discussed above.

The apparatus 400 of FIGS. 4 and 5 further includes a volume-tunable-material 450. In the example embodiment, the volume-tunable-material 450 is located over the substrate 410, and encompasses at least first ends 433 of the plurality of nanostructures 430. In certain embodiments, not shown, the volume-tunable-material 450 is attached to the surface 420 of the substrate 410 using an anchoring layer. The anchoring layer, in this embodiment, acts as an adhesive layer configured to attach the substrate 410 and volume-tunable-material 450. In one embodiment, an anchoring layer of poly (glycidylmethacrylate) (PGMA) can be covalently bonded to both the substrate 410 and the volume-tunable-material 450 (e.g., one of polyacrylamide hydrogel). Examples of forming a PGMA layer and coupling it to a polyacrylamide hydrogel layer are presented in U.S. patent application Ser. Nos. 10/773,120, and 11/239,973, which are incorporated by reference herein in their entirety.

The volume-tunable-material 450 may comprise any material that will change in thickness when subjected to a stimulus. For example, in one embodiment the volume-tunable-material 450 comprises a polymer layer. The polymer layer may be either organic or inorganic. In another embodiment, however, the polymer layer is a hydrogel layer. Nevertheless, the polymer layer may comprise other known or hereafter discovered materials that function as the volume-tunable-material 450. Additionally, other volume-tunable-materials 450 that are not polymers might be used.

As is illustrated by FIG. 4, when the volume-tunable-material 450 is in a first state, for example having a first thickness ($t_1$), associated second ends 438 of the plurality of nanostructures 430 are bent toward one another. In this state, two or more similarly configured clumps 440 exist, each including two or more nanostructures 430. Actually, in the embodiment of FIG. 4, three similarly configured clumps 440, each having only four nanostructures 430, exist.

However, as illustrated by FIG. 5, when the volume-tunable-material 450 is in a second state, for example having a second thickness ($t_2$), associated second ends 438 of the plurality of nanostructures 430 are not bent as much toward one another. For instance, in the example embodiment of FIG. 5, the associated second ends 438 of the plurality of nanostructures 430 are not bent toward one another at all, and thus the two or more similarly configured clumps 440 do not exist.

Many different stimuli may be used to alter the thickness of the volume-tunable-material 450, for example between the configurations of FIGS. 4 and 5, depending on the material composition thereof. In one embodiment, the volume-tunable-material 450 might be responsive to changes in humidity. For instance, a stimulus consisting of moisture could be used to change the thickness of the volume-tunable-material 450, and cause the plurality of nanostructures 430 to clump or unclump as illustrated in FIGS. 4 and 5. Alternatively, however, the volume-tunable-material 450 might be responsive to changes in temperature. For example, the volume-tunable-material 450 might comprise hydrogels such as N-isopropylacrylamide and N,N'-methylenebisacrylamide that can swell by at least about five times as the temperature is lowered from above 37° C. to below 32° C. (e.g., a change in temperature of at least about 5° C.).

Additionally, the volume-tunable-material 450 might comprise a material that swells and contracts significantly in response to variations in the pH of a fluid located thereby. Examples of pH-sensitive volume-tunable-materials include polymers of hydroxyethyl methacrylate-co-methacrylic acid and tetraethylene glycol dimethacrylate. These polymers may swell substantially more under basic conditions than under acidic conditions. Alternately, the volume-tunable-material 450 might swell and contract significantly in response to changes of a metal ion concentration in a fluid located thereby, e.g., a variation in a Cu, Ni, Co, and Pd ion concentration. Examples of such metal ion-sensitive volume-tunable-materials 450 include polymers of acryl amide-co-2-vinylpyridine and N,N'-methylenebisacrylamide.

After the thickness of the volume-tunable-material 450 has changed from a first thickness ($t_1$) to a second thickness ($t_2$), or vice-versa, the thickness of the volume-tunable-material 450 may then return back to its previous state. Such a reversal, in one exemplary embodiment, causes the plurality of nanostructures 140 to substantially, if not completely, return to the first orientation. Accordingly, the apparatus 400 may be actuated over and over again, each time the plurality of nanostructures 430 returning to the original state, going from clumped to open.

As one skilled in the art would expect, the reversal of the thickness of the volume-tunable-material 450 back to its previous state may be accomplished by subjecting the volume-tunable-material 450 to an opposite stimulus as it was originally subjected to, or just removing the existence of the original stimulus. For instance, if a heating source was used to cause the thickness of the volume-tunable-material 450 to change thicknesses, the volume-tunable-material 450 could then be subjected to a cooling source to return it to its previous thickness. Alternatively, if moisture was used to cause the initial change in thickness, the environment could be allowed to dry, and thereby return the volume-tunable-material 450 to its previous thickness.

Unique to various embodiments, the apparatus 400 may achieve very fast response times. For instance, when a water droplet is placed on the volume-tunable-material 450 in a contracted state, such as that shown in FIG. 4, it may take only about 60 milliseconds to move to an expanded state, such as that shown in FIG. 5. Additionally, the reverse transformation of the volume-tunable-material 450 back to the contracted state may only take about 4 seconds, if unassisted by drying. Obviously, this time would be greatly accelerated if the drying process were facilitated using airflow in the system and/or by increasing the temperature. It is believed that similar switching speeds might be obtained for many other embodiments.

FIG. 6 illustrates a flow diagram 600 indicating how one might manufacture an apparatus according to an alternative embodiment of the disclosure. For purposes of discussion, an apparatus similar to the apparatus of FIGS. 4 and 5 will be manufactured using the flow diagram 600 of FIG. 6. Nevertheless, in a different embodiment, the flow diagram 600 of FIG. 6 might be used to manufacture an apparatus different from the apparatus 400 of FIGS. 4 and 5.

The flow diagram 600 uses many of the same manufacturing steps as used in the flow diagram 200. Accordingly, like reference numerals are being used to indicate similar steps. In actuality, the only illustrated difference between the flow diagram 200 and the flow diagram 600 is that the flow diagram 600 exchanges the step 250 of FIG. 2 with the new step 610 of FIG. 6.

The new step 610, which occurs after previous step 240, includes forming the volume-tunable-material 450 around (e.g., encompassing) the first ends 433 of the plurality of nanostructures 430. The volume-tunable-material 450 may be formed using a variety of different processes. However, in one embodiment the volume-tunable-material 450 is formed by sandwiching a polymerizate solution between the substrate 410 and an upper confining surface (not shown). Accordingly, the plurality of nanostructures 430 would be surrounded with the polymerizate solution. The polymerizate solution may be placed between the substrate 410 and the upper confining surface using many different processes; however, in one embodiment the polymerizate solution is deposited therebetween by dip coating or drop casting. Other placement methods could nonetheless also be used.

Depending on the design of the apparatus, the polymerizate solution may vary. In the given embodiment of FIGS. 4 and 5, however, the polymerizate solution includes acrylamide (AA) in water solution, with a cross linking agent (e.g., N,N'-methylenebisacrylamide (bis-AA)) and an initiator (e.g., ammonium persulfate (APS)). In this embodiment the polymerizate solution might include about 40 wt % of AA, about 2 wt % of bis-AA and about 2 wt % of APS in water. Such a polymerizate solution might result in a volume-tunable-material 450 that changes its thickness based upon moisture changes. Those skilled in the art of polymer chemistry, would nonetheless understand the different polymerizate solutions that might be used herein.

Thereafter, the polymerizate solution might be subjected to a thermo-initiated polymerization step, thereby forming the volume-tunable-material 450. The thermo-initiated polymerization step, in one embodiment, includes placing the apparatus 400 having the polymerizate solution within a heat source and annealing the apparatus at about 50° C. for about 1 hour to initiate polymerization. Those skilled in the art understand, however, that the time for the polymerization reaction may vary with the desired thickness of the final volume-tunable material 450. Accordingly, the disclosed time is but one example.

After conducting the thermo-initiated polymerization step, the apparatus 400 maybe rinsed to remove unreacted monomers and cross-linked molecules therefrom. Thereafter, the apparatus 400 may be dried in a vacuum, thus resulting in the contracted volume-tunable-material 450 illustrated in FIG. 4. The applied stimulus could then be used to expand the volume-tunable-material 450, as shown in FIG. 5.

Additional details for the processes used for forming an apparatus in accordance with the above-described manufacturing method may be found in U.S. patent application Ser. No. 11/279,220, entitled "Environmentally Sensitive Nanostructured Surfaces", which is incorporated by reference as if reproduced herein in its entirety.

Apparatus, such as those discussed in the paragraphs above, as well as those covered by the disclosure but not specifically discussed, may have many different uses. For example, in various embodiments the apparatus may be used for their optical properties. For instance, the apparatus could be used as a tunable diffraction grating. In other embodiments, the apparatus could be used for different 3-d photonic structures. In yet different embodiments, the apparatus could be used to characterize structures. For example, a biological cell can be placed on the clumped structure and by moving the tips, one can measure the mechanical response of the cell. In other embodiments, the apparatus could be used as a substance or drug-release system. For example, the exposing of the volume-tunable-material to the stimulus could cause the clumps to open up, thereby releasing an active particle stored in the clump. Such apparatuses with the regular arrays of differently configured clumps that have the dimensions on a sub-micron scale and have the ability to open and close, are unattainable by other conventional nanostructure fabrication techniques.

The phrase "providing an apparatus", as used herein, means that the apparatus may be obtained from a party having already manufactured the feature, or alternatively may mean manufacturing the feature themselves and providing it for its intended purpose.

Although the present invention has been described in detail, those skilled in the art should understand that they can make various changes, substitutions and alterations herein without departing from the spirit and scope of the invention in its broadest form.

What is claimed is:

1. An apparatus, comprising:
   a substrate having a surface;
   a plurality of nanostructures each having a first end and a second end, wherein the first end of each of the plurality of nanostructures is attached to the surface; and
   wherein at least a portion of the second ends of the plurality of nanostructures are bent toward one another to form two or more similarly configured clumps, each of the two or more similarly configured clumps including two or more nanostructures.

2. The apparatus of claim 1 wherein the second ends of the two or more similarly configured clumps are touching.

3. The apparatus of claim 2 wherein an adhesive fixes the second ends of the two or more similarly configured clumps together.

4. The apparatus of claim 1 wherein the second ends of the two or more similarly configured clumps do not touch.

5. The apparatus of claim 1 wherein the first ends of each of the plurality of nano structures are located within a volume-tunable-material, the volume-tunable-material configured to bend the second ends of the plurality of nanostructures toward or away from one another.

6. The apparatus of claim 5 wherein the volume-tunable-material is a polymer layer.

7. The apparatus of claim 5 wherein the volume-tunable-material is a hydrogel layer.

8. The apparatus of claim 1 wherein the two or more clumps each include only two nano structures.

9. The apparatus of claim 1 wherein the two or more clumps each include only four nanostructures.

10. A method for manufacturing, comprising:
    forming a plurality of nanostructures over a substrate, each of the plurality of nanostructure having a first end attached to the substrate and a second end;
    bringing together at least a portion of the second ends to form two or more similarly configured clumps, each of the two or more similarly configured clumps including two or more nanostructures.

11. The method of claim 10 wherein bringing together includes bringing together using capillary forces between a droplet of liquid and the two or more nano structures.

12. The method of claim 10 wherein bringing together includes causing the second ends of the two or more similarly configured clumps to touch one another.

13. The method of claim 12 further including applying an adhesive after bringing together, the adhesive configured to fix the second ends of the two or more similarly configured clumps.

14. The method of claim 10 wherein plastic deformation in the at least a portion of the second ends causes the at least a portion of the second ends of the two or more similarly configured clumps to remain at least partially bent toward one another after the bringing.

15. The method of claim 14 wherein the second ends remain bent toward one another but do not touch.

16. The method of claim 10 further including forming a volume-tunable-material around the first ends of each of the plurality of nano structures, and further wherein the volume-tunable-material is configured to bend the at least a portion of the second ends of nanostructures toward or away from one another by changing a volume thereof.

17. The method of claim 16 wherein the volume-tunable-material is a polymer layer.

18. The method of claim 16 wherein the volume-tunable-material is a hydrogel layer.

19. The method of claim 10 wherein the two or more clumps each include only two nanostructures.

20. The method of claim 10 wherein the two or more clumps each include only four nanostructures.

21. A method of use, comprising:
    providing an apparatus, the apparatus including;
       a substrate having a surface;
       a plurality of nanostructures each having a first end and a second end, wherein the first ends of each of the plurality of nanostructures are attached to the surface; and
       a volume-tunable-material encompassing the first ends; and
    exposing the volume-tunable-material to a stimulus, the stimulus changing a thickness of the volume-tunable-material and thereby bringing together at least a portion of the second ends to form two or more similarly configured clumps of two or more nanostructures or moving apart the second ends of two or more similarly configured clumps of two or more nano structures.

22. The use of claim 21 wherein exposing the volume-tunable-material to the stimulus increases a thickness thereof, thus causing the second ends of the two or more similarly configured clumps to move apart and release an active particle.

* * * * *